United States Patent
Liu et al.

(10) Patent No.: US 10,431,587 B2
(45) Date of Patent: Oct. 1, 2019

(54) SEMICONDUCTOR DEVICE FOR AVOIDING SHORT CIRCUIT BETWEEN ADJACENT STORAGE NODES AND MANUFACTURING METHOD THEREOF

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Tzu-Tsen Liu, Kaohsiung (TW); Li-Wei Feng, Kaohsiung (TW); Chien-Ting Ho, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/859,756

(22) Filed: Jan. 2, 2018

(65) Prior Publication Data

US 2018/0197865 A1 Jul. 12, 2018

(30) Foreign Application Priority Data

Jan. 6, 2017 (CN) .......................... 2017 1 0011195

(51) Int. Cl.
| | |
|---|---|
| H01L 27/108 | (2006.01) |
| H01L 29/08 | (2006.01) |
| H01L 23/528 | (2006.01) |
| H01L 23/522 | (2006.01) |
| H01L 21/768 | (2006.01) |
| H01L 21/311 | (2006.01) |

(52) U.S. Cl.
CPC .. *H01L 27/10808* (2013.01); *H01L 21/31111* (2013.01); *H01L 21/31144* (2013.01); *H01L 21/76802* (2013.01); *H01L 21/76877* (2013.01); *H01L 23/5226* (2013.01); *H01L 23/5283* (2013.01); *H01L 27/10855* (2013.01); *H01L 29/0847* (2013.01); *H01L 27/10814* (2013.01); *H01L 27/10823* (2013.01)

(58) Field of Classification Search
CPC .................... H01L 27/10808; H01L 27/10814
See application file for complete search history.

(56) References Cited

U.S. PATENT DOCUMENTS

| | | | | |
|---|---|---|---|---|
| 2014/0306351 A1* | 10/2014 | Kim | ............... | H01L 21/76855 257/774 |
| 2014/0327062 A1* | 11/2014 | Park | ............... | H01L 28/60 257/296 |
| 2015/0371685 A1* | 12/2015 | Shin | ............... | H01L 29/0649 257/506 |
| 2016/0181385 A1* | 6/2016 | Kim | ............... | H01L 29/66621 257/4 |
| 2016/0276349 A1 | 9/2016 | Kwon | | |

* cited by examiner

*Primary Examiner* — Victoria K. Hall
(74) *Attorney, Agent, or Firm* — Winston Hsu

(57) ABSTRACT

A semiconductor device and a manufacturing method thereof are provided. The method includes providing a substrate, a plurality of word lines and a plurality of bit lines, and then forming a storage node contact on each source/drain region, so that a width of a top surface of each storage node contact in a direction is less than a width of a bottom surface of each storage node contact.

5 Claims, 7 Drawing Sheets

SEMICONDUCTOR DEVICE FOR AVOIDING SHORT CIRCUIT BETWEEN ADJACENT STORAGE NODES AND MANUFACTURING METHOD THEREOF

BACKGROUND OF THE INVENTION

1. Field of the Invention

The present invention relates to a semiconductor device and a manufacturing method thereof, and more particularly, to a dynamic random access memory for avoiding a short circuit between adjacent storage nodes and a manufacturing method thereof.

2. Description of the Prior Art

Generally, the unit structure of dynamic random access memory (DRAM) is composed of a transistor and a capacitor configured to store charge for recording required data. As the applications increase, the size of DRAM has to be shrunk for increasing the DRAM integrity, enhancing the operation speed of the device, increasing the storage of the DRAM, and satisfying the demands from consumers for miniaturizing electronic devices.

In the general DRAM, transistors are formed in a substrate, and word lines are used to connect the transistors aligned in the same direction in series. Bit lines crossing the word lines are then formed on the transistors. For preventing the bit lines from being electrically connected with the word lines, storage node contacts may be connected to source/drain regions of the transistors via regions surrounded by any two adjacent word lines and any two adjacent bit lines. Subsequently, a storage node, a capacitance dielectric layer, and a top electrode of the capacitor may be sequentially formed on the each of the storage node contacts. For reducing the area of each capacitor in the chip as much as possible and keeping specific capacitance, the capacitors are formed to be higher and thinner. Therefore, openings with higher aspect ratio have to be formed on the storage node contacts in the step of forming the storage nodes, and each of the openings has to be formed corresponding to only one of the storage node contacts for forming the capacitor electrically connected to the corresponding storage node contact.

However, as the critical dimension becomes smaller and smaller, one opening with high aspect ratio may contact two storage node contacts because of the alignment shift in the photolithographic process, the storage node subsequently formed will be electrically connected with two adjacent storage node contacts, and the short circuit between the storage node contacts may occur accordingly.

SUMMARY OF THE INVENTION

An object of the present invention is to provide a semiconductor device and a manufacturing method thereof for avoiding a storage node from contacting two adjacent storage nodes and a short circuit between the storage nodes.

A semiconductor device is provided by an embodiment of the present invention. The semiconductor device includes a substrate, a plurality of word lines, a plurality of bit lines, and a plurality of storage node contacts. The substrate includes a plurality of active regions, and each of the active regions includes two source/drain regions disposed at two ends of the active ends of the active region. The word lines are disposed in the substrate, and each of the word lines is disposed elongated in a first direction. The bit lines are disposed on the substrate, and each of the bit lines is disposed elongated in a second direction and straddling the word lines. Each of the source/drain regions is disposed in a region surrounded by two of the word lines adjacent to each other and two of the bit lines adjacent to each other. The storage node contacts are disposed on the source/drain regions respectively, wherein a width of a top surface of each of the storage node contacts in the second direction is smaller than a width of a bottom surface of each of the storage node contacts in the second direction.

A manufacturing method of a semiconductor device is provided by another embodiment of the present invention. Firstly, a substrate, a plurality of word lines, and a plurality of bit lines are provided. The substrate includes a plurality of active regions. Each of the active regions includes two source/drain regions. The word lines are embedded in the substrate, and each of the word lines is disposed elongated in a first direction. The bit lines are disposed on the substrate, and each of the bit lines is disposed elongated in a second direction and straddling the word line. Each of the source/drain regions is disposed in a region surrounded by two of the word lines adjacent to each other and two of the bit lines adjacent to each other. A plurality of dielectric strips are then formed on the substrate, and each of the dielectric strips is disposed between two of the bit lines adjacent to each other. The dielectric strips are then patterned for forming a dielectric block on each of the source/drain regions respectively, wherein a first through hole is formed between any two of the dielectric blocks adjacent to each other. An insulation block is formed in each of the first through holes respectively. The dielectric blocks are removed for forming a second through hole between any two of the insulation blocks adjacent to each other. A storage node contact is formed in each of the second through holes respectively, wherein a width of a top surface of each of the storage node contacts in the second direction is smaller than a width of a bottom surface of each of the storage node contacts in the second direction.

In the present invention, the allowable range of shifting error in a second direction may be increased by forming the storage node contacts having a top surface narrower than a bottom surface of each of the storage node contacts in the second direction. The short circuit problem between a storage node and two adjacent storage node contacts which is generated by manufacturing variations may be improved accordingly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
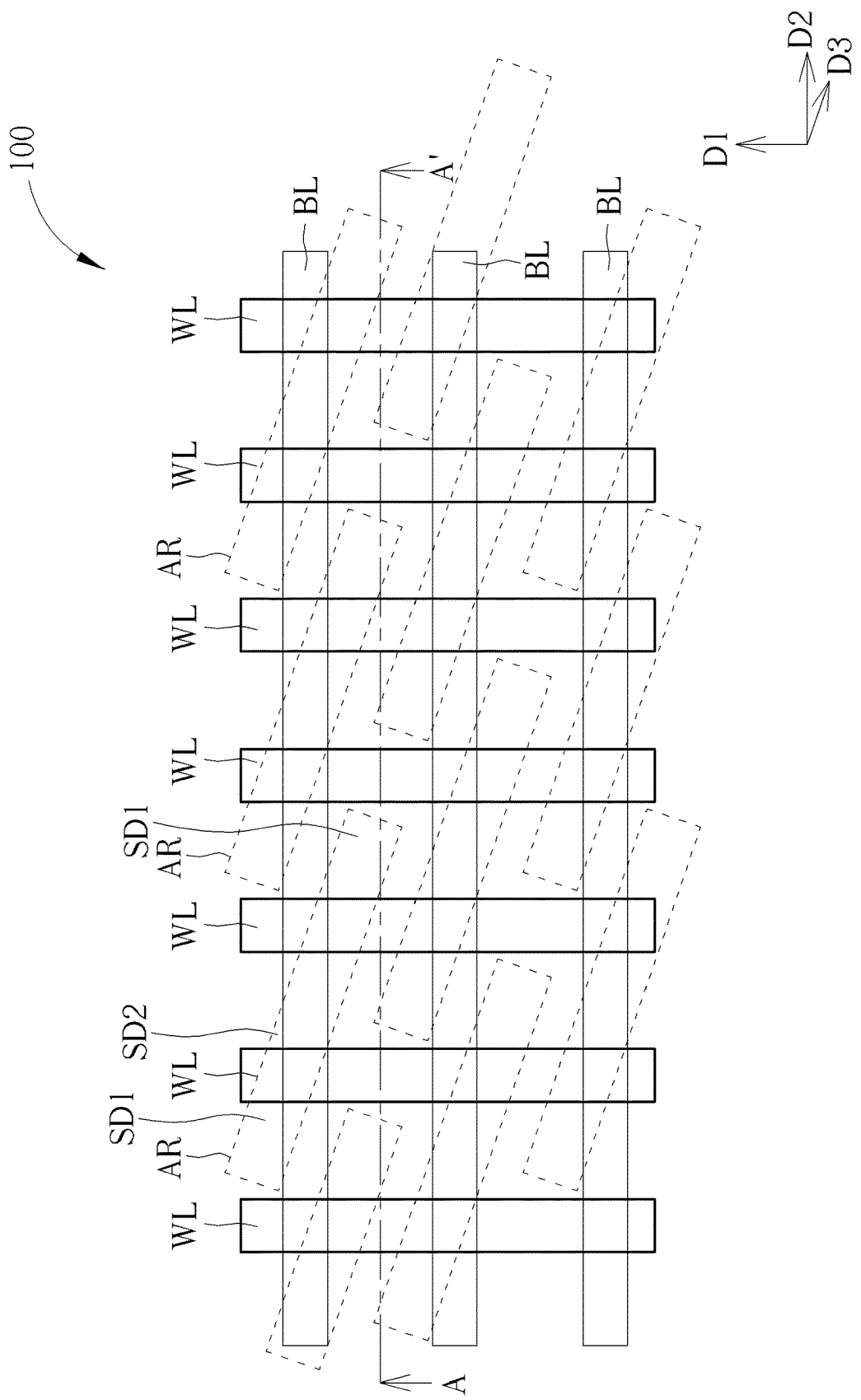
FIG. 1 is a top view schematic drawing illustrating a semiconductor device according to an embodiment of the present invention.
Figure 2:
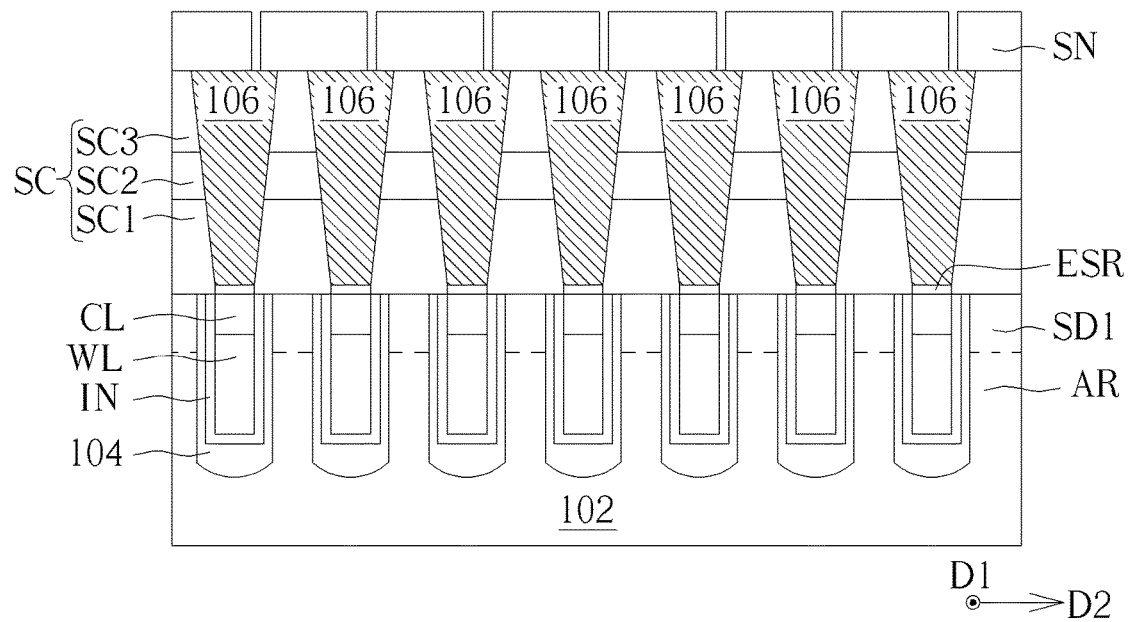
FIG. 2 is a cross-sectional diagram taken along a line A-A' in FIG. 1.

Please refer to FIG. 1 and FIG. 2. FIG. 1 is a top view schematic drawing illustrating a semiconductor device according to an embodiment of the present invention. FIG. 2 is a cross-sectional diagram taken along a line A-A' in FIG.

1. FIG. 1 and FIG. 2 only illustrate a memory cell region with capacitors disposed therein in the semiconductor device, but not limited thereto. As shown in FIG. 1 and FIG. 2, a semiconductor device 100 in this embodiment includes a substrate 102, a plurality of word lines WL, a plurality of bit lines BL, and a plurality of storage node contacts SC. The substrate 102 may include a plurality of active regions AR disposed parallel with one another, and each of the active regions AR may be a stripe structure extending in a third direction D3. Specifically, the semiconductor device 100 may include a device isolation layer 104 disposed in the substrate 102 and surrounding the active regions AR for defining the active regions AR and insulating the active regions AR from one another. A top surface of the device isolation layer 104 and a top surface of the substrate 102 may be coplanar. Additionally, each of the active regions AR may include two first source/drain regions SD1 and one second source/drain region SD2. The first source/drain regions SD1 is located at two ends of each of the active regions AR, and the second source/drain region SD2 is located between the first source/drain regions SD1.

The word lines WL are disposed in the substrate 102 and disposed parallel with one another, and each of the word lines WL is disposed extending in a first direction D1 different from the third direction D3. Therefore, the word lines WL cross the corresponding active regions AR for being used as gate electrodes. For example, two adjacent word lines WL may be disposed straddling the same active region AR, and each of the two adjacent word lines WL is disposed between the second source/drain region SD2 and one of the first source/drain region SD1 for separating the first source/drain regions SD1 from the second source/drain region SD2. Additionally, the word lines WL may be buried in the substrate 102, and the top surfaces of the word lines WL may be lower than the top surface of the substrate 102. An insulation layer IN may be disposed between each of the word lines WL and the corresponding active region AR for insulating each of the word lines WL from the active regions AR, and the insulation layer IN may be used as a gate insulation layer. A cap layer CL may be disposed above each of the word lines WL for protecting each of the word lines WL from damage generated by subsequent processes. A top surface of the cap layer CL and the top surface of the substrate 102 may be coplanar, for example. In addition, each of the word lines WL may be formed by conductive materials such as polysilicon, doped polysilicon, metal, or metal silicide.

The bit lines BL are disposed on the substrate 102 and disposed parallel with one another. Each of the bit lines BL may be disposed extending in a second direction D2 different from the third direction D3 and the first direction D1. Therefore, the bit lines BL may be disposed straddling the word lines WL and the active regions AR. Each of the bit lines BL may be electrically connected with the second source/drain region SD2 of the active region AR which is arranged on the second direction D2. For example, the first direction D1 may be perpendicular to the second direction D2, and an included angle between the third direction D3 and the second direction D2 may be an acute angle. Therefore, each of the first source/drain regions SD1 may be disposed in a region surrounded by two of the word lines WL adjacent to each other and two of the bit lines BL adjacent to each other. Additionally, the bit lines BL may be electrically insulated from the word lines WL by the cap layer CL, and another insulation layer (not shown) may be disposed between the bit line BL and the first source/drain region SD1 for electrically insulating the bit line BL from the first source/drain region SD1. A sidewall spacer (not shown) may be disposed on the sidewall of each of the bit lines BL, and another cap layer (not shown) may be disposed above each of the bit lines BL for protecting the bit lines BL from damage generated by subsequent processes.

The storage node contacts SC are disposed on corresponding first source/drain regions SD1 respectively for electrically connecting each of the first source/drain regions SD1 to a capacitor (not shown). A width of a top surface of each of the storage node contacts SC in the second direction D2 is smaller than a width of a bottom surface of each of the storage node contacts SC in the second direction D2. Specifically, the semiconductor device 100 may further include a plurality of insulation blocks 106 disposed on the cap layer CL between two adjacent bit lines BL. A second through hole TH2 is located between any two of the insulation blocks 106 adjacent to each other, and the second through holes TH2 are located corresponding to the first source/drain regions SD1. Each of the storage node contacts SC is disposed in one of the second through holes TH2 respectively for electrically connecting with the corresponding first source/drain region SD1. Each of the second through holes TH2 may be composed of two of the insulation blocks 106 and the sidewall spacer. Each of the second through holes TH2 has a trapezoid shape in the second direction D2 because each of the insulation blocks 106 has an upside-down trapezoid shape in the second direction D2. Therefore, the storage node contact SC disposed in the second through hole TH2 has a trapezoid shape in the second direction D2. A top surface of the storage node contact SC and a top surface of the insulation block 106 may be located within the same horizontal plane. In addition, the storage node contact SC may be electrically insulated from the bit lines BL by the sidewall spacer disposed on the sidewalls of the bit lines BL. In this embodiment, each of the storage node contacts SC may include a multi-layer structure. For instance, the multi-layer structure may include a stacked structure composed of a polysilicon layer SC1, a cobalt silicide layer SC2, and a tungsten layer SC3 stacked sequentially, but the present invention is not limited to this. Additionally, an etching stop block ESR may be disposed between the insulation block 106 and the corresponding cap layer CL in this embodiment.

The semiconductor device 100 may further include a plurality of storage nodes SN disposed on the storage node contacts SC and the insulation blocks 106, and the storage nodes SN contact the corresponding storage node contacts SC. The storage node SN may be used as a bottom electrode of a capacitor, and a capacitance dielectric layer and a top electrode (not shown) may be disposed on the storage node SN. In another embodiment, the storage node SN may be a connecting pad disposed between the storage node contact SC and a bottom surface of a capacitor for electrically connecting the storage node contact SC and the bottom electrode. It is worth noting that, compared with the design where the insulation block 106 has a rectangular shape in the second direction, the spacing between top surfaces of adjacent storage node contacts SC in the second direction D2 may be increased because the insulation block 106 configured to insulate the storage node contact SC from adjacent storage node contacts SC has an upside-down trapezoid shape in the second direction D2. Accordingly, the allowable range of shifting error in the second direction D2 during the step of forming the storage nodes SN may be increased, and the short circuit problem between the storage node SN and two adjacent storage node contacts SC which is generated by manufacturing variations may be improved.

Figure 3:
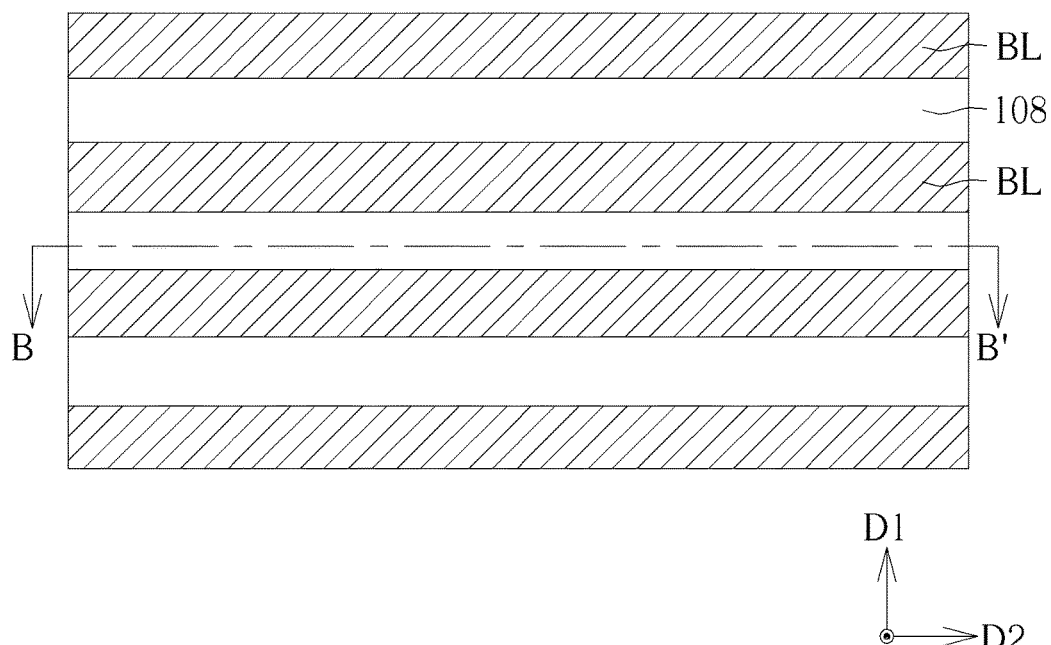
FIGS. 3-13 are schematic drawings illustrating a manufacturing method of a semiconductor device according to an embodiment of the present invention.
Figure 4:
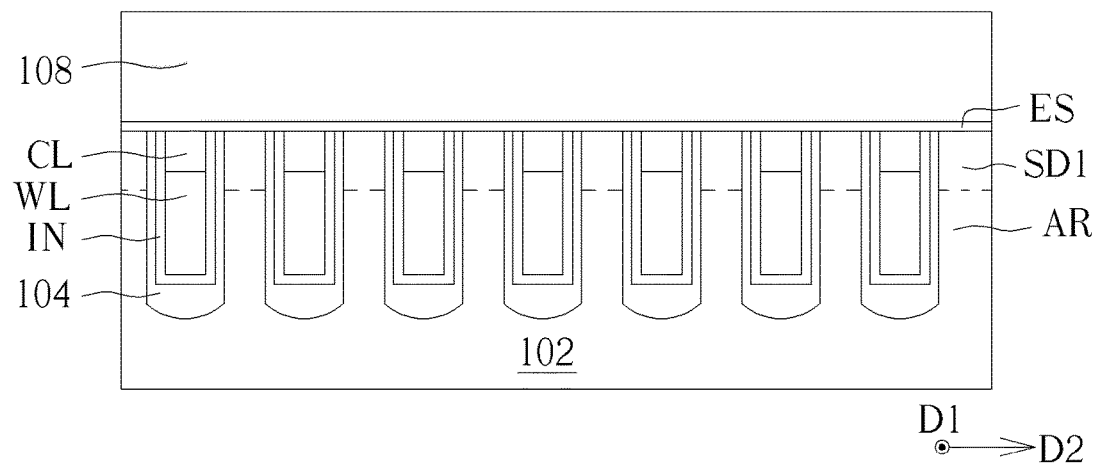
Figure 5:
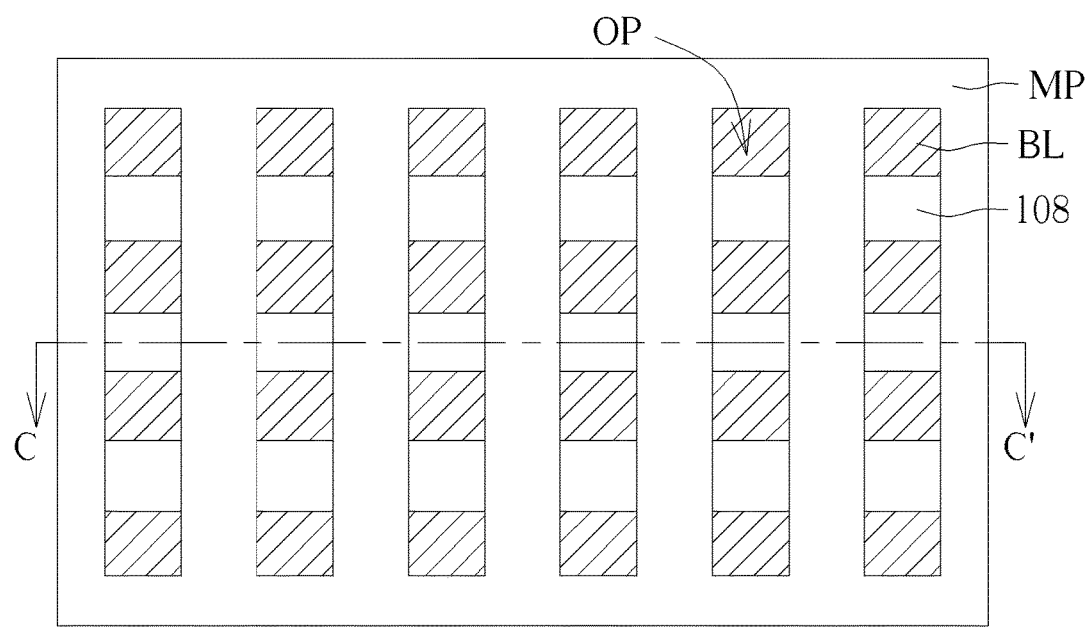
Figure 6:
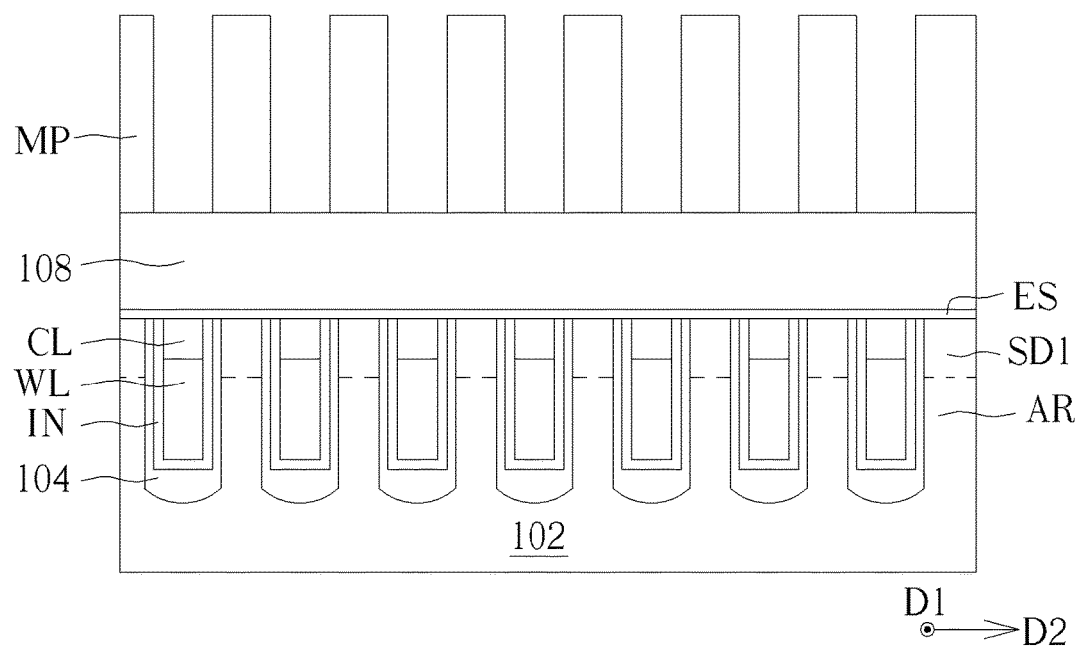
Figure 7:
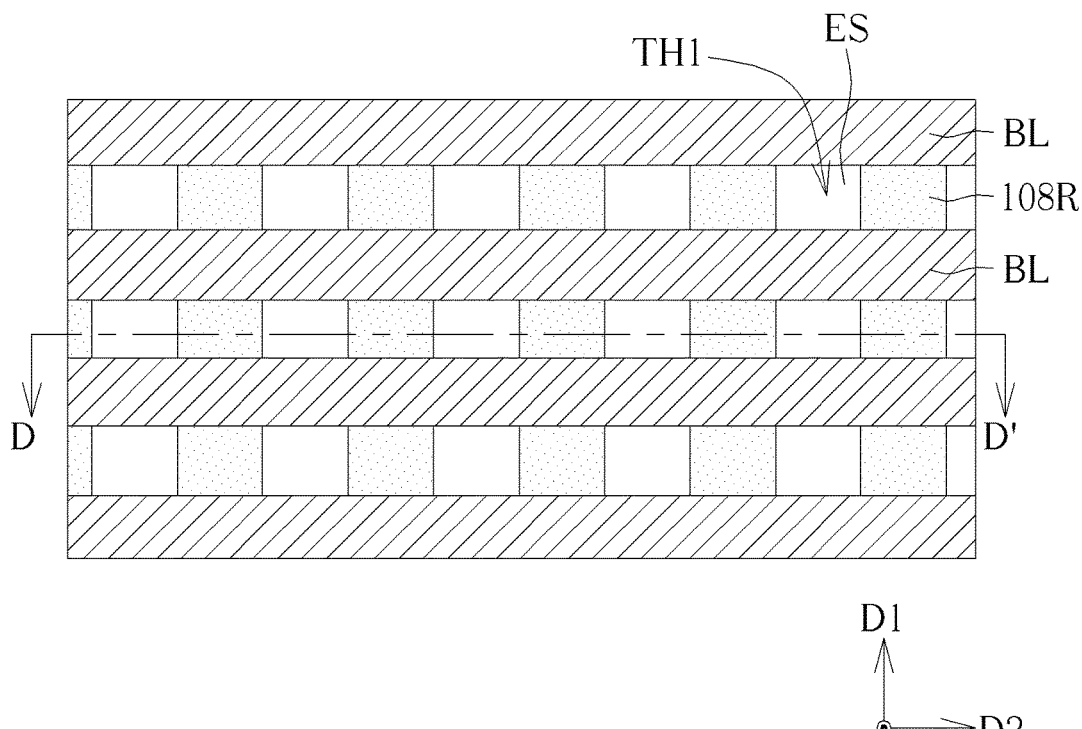
Figure 8:
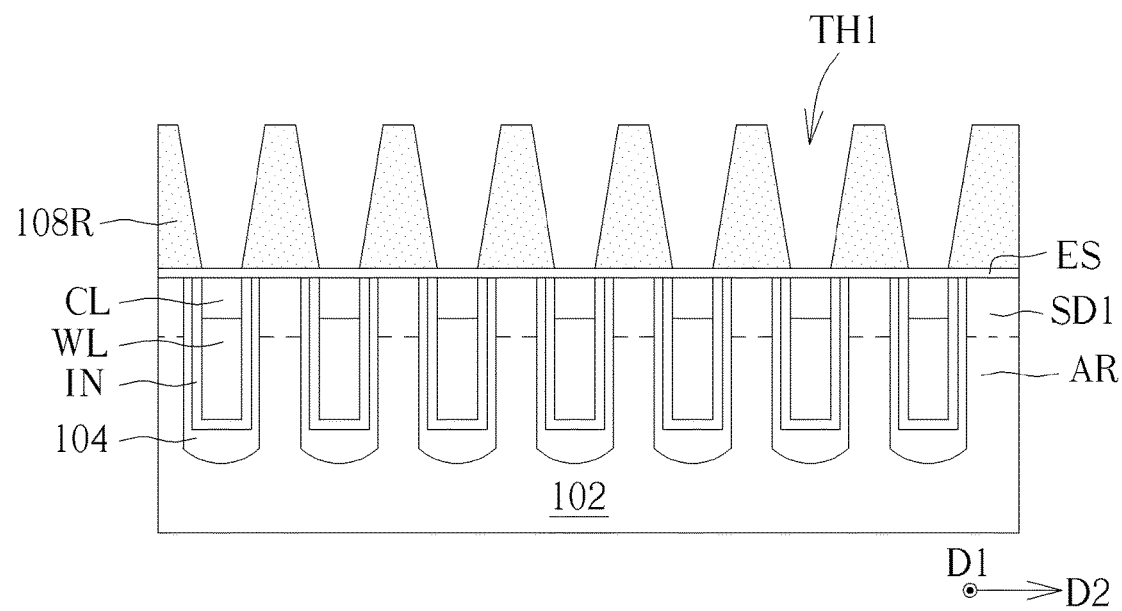

A manufacturing method of the semiconductor device 100 in this embodiment will be described in the following contents. Please refer to FIGS. 3-13, FIG. 1, and FIG. 2. FIGS. 3-13 are schematic drawings illustrating a manufacturing method of a semiconductor device according to an embodiment of the present invention. FIG. 4 is a cross-sectional diagram taken along a line B-B' in FIG. 3. FIG. 6 is a cross-sectional diagram taken along a line C-C' in FIG. 5. FIG. 8 is a cross-sectional diagram taken along a line D-D' in FIG. 7. FIG. 10 is a cross-sectional diagram taken along a line E-E' in FIG. 9. FIG. 12 is a cross-sectional diagram taken along a line F-F' in FIG. 11. Firstly, as shown in FIG. 3 and FIG. 4, the substrate 102, the word lines WL, and the bit lines BL are provided. In this situation, the sidewall spacer is disposed on the sidewalls of the bit lines BL, and a cap layer is disposed on the bit lines BL. The specific disposition of the substrate 102, the word lines WL, and the bit lines BL in this embodiment may be similar to the condition described above and will not be redundantly described. In this embodiment, the step of providing the substrate 102, the word lines WL, and the bit lines BL may selectively include providing an etching stop layer ES covering the substrate 102 and the word lines WL, but the present invention is not limited to this. Subsequently, a dielectric layer may be formed covering the etching stop layer ES and the cap layer on the bit lines BL by a deposition process, and the dielectric layer on the cap layer may be removed by a planarization process till exposing the cap layer for forming a plurality of self-aligned dielectric strips 108 on the substrate 102. Each of the dielectric strips 108 is disposed between two of the bit lines BL adjacent to each other respectively.

Subsequently, the dielectric strips 108 are patterned for forming a dielectric block 108R on each of the first source/drain regions SD1 respectively, wherein a first through hole TH1 s formed between any two of the dielectric blocks 108R adjacent to each other. Specifically, as shown in FIG. 5 and FIG. 6, a mask pattern MP is formed on the dielectric strips 108 and the bit lines BL, wherein the mask pattern MP includes a plurality of stripe openings OP straddling the dielectric strips 108 and the bit lines BL. In other words, each of the stripe openings OP is disposed elongated in an extending direction (i.e. the first direction D1) of the word line WL and disposed right above the corresponding word line WL. For example, the mask pattern MP may be formed by a tri-layer structure. The tri-layer structure may include a stacked structure including an organic layer, a silicon-containing layer, and a photoresist layer, for example. A photolithographic process may then be performed for patterning the photoresist layer and forming a photoresist pattern. For instance, the silicon-containing layer may be a silicon-containing hard mask bottom anti-reflective coating (SHB) for reducing the reflection light between the photoresist layer and the substrate 102. Subsequently, an etching process is performed to the silicon-containing layer with the photoresist pattern as a mask for transferring the pattern of the photoresist pattern to the silicon-containing layer and forming a silicon-containing pattern. An etching process is then performed to the organic layer with the silicon-containing pattern as a mask for transferring the pattern of the silicon-containing pattern to the organic layer, and the photoresist pattern is removed for forming the mask pattern MP. Subsequently, as shown in FIG. 7 and FIG. 8, an etching process is performed with the mask pattern MP and the cap layer above the bit lines BL as a mask for etching the dielectric strips 108 and forming the dielectric blocks 108R and the first through holes TH1. Each of the first through holes TH1 maybe defined by two adjacent dielectric blocks 108R and two adjacent bit lines BL. A width of a top surface of each of the dielectric blocks 108R in the second direction D2 may be smaller than a width of a bottom surface of each of the dielectric blocks 108R in the second direction D2 by controlling the etching process mentioned above.

Figure 9:
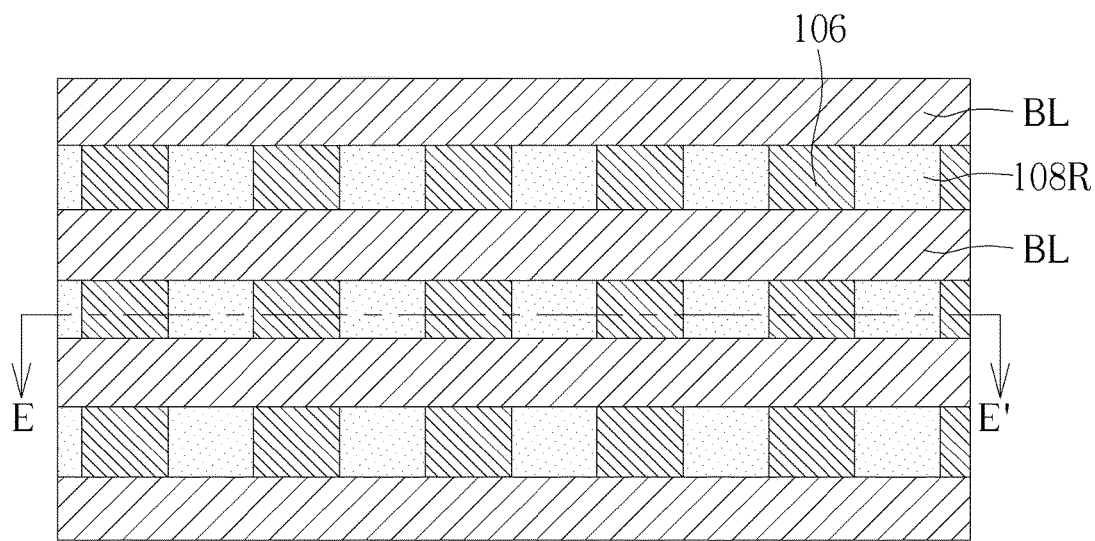
Figure 10:
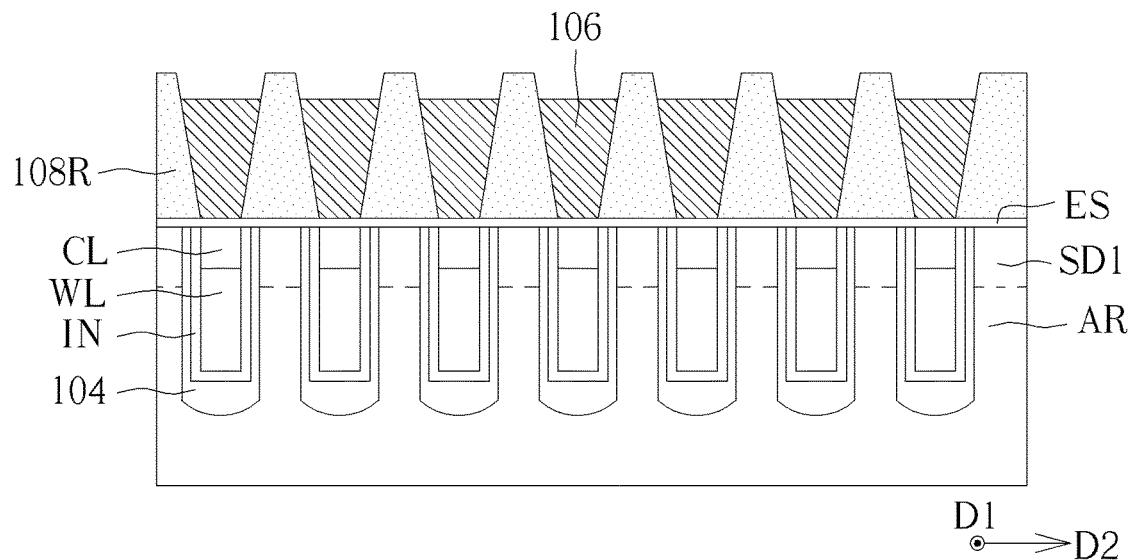

As shown in FIG. 9 and FIG. 10, the insulation blocks 106 are then formed in the first through holes TH1 respectively. Specifically, an insulation layer is deposited on the dielectric blocks 108R and the bit lines BL, wherein the first through holes TH1 are filled with the insulation layer. When there are other peripheral devices on a peripheral region outside the memory cell region in the semiconductor device, a mask may be formed on the insulation layer for covering the insulation layer on the peripheral region, and the mask may have an opening exposing the insulation layer in the memory cell region. An etching process is then performed for etching the insulation layer in the memory cell region until the dielectric blocks 108R are exposed and forming the insulation blocks 106. A width of a top surface of each of the insulation blocks 106 formed by the method described above in the second direction D2 may be larger than a width of a bottom surface of the insulation block 106 in the second direction D2. For instance, each of the insulation blocks 106 may have an upside-down trapezoid shape in the second direction D2. The mask may then be removed.

Figure 11:
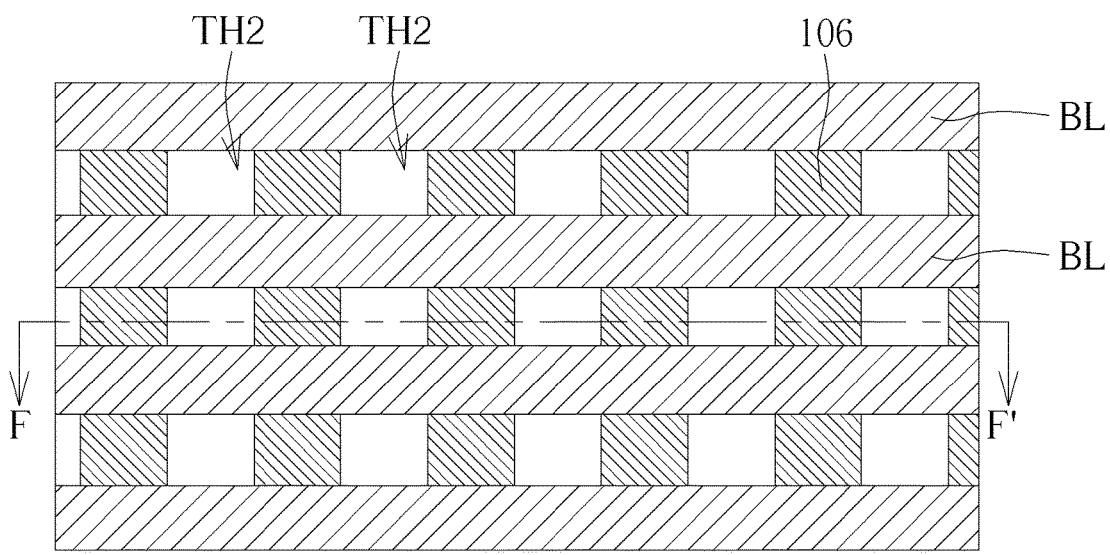
Figure 12:
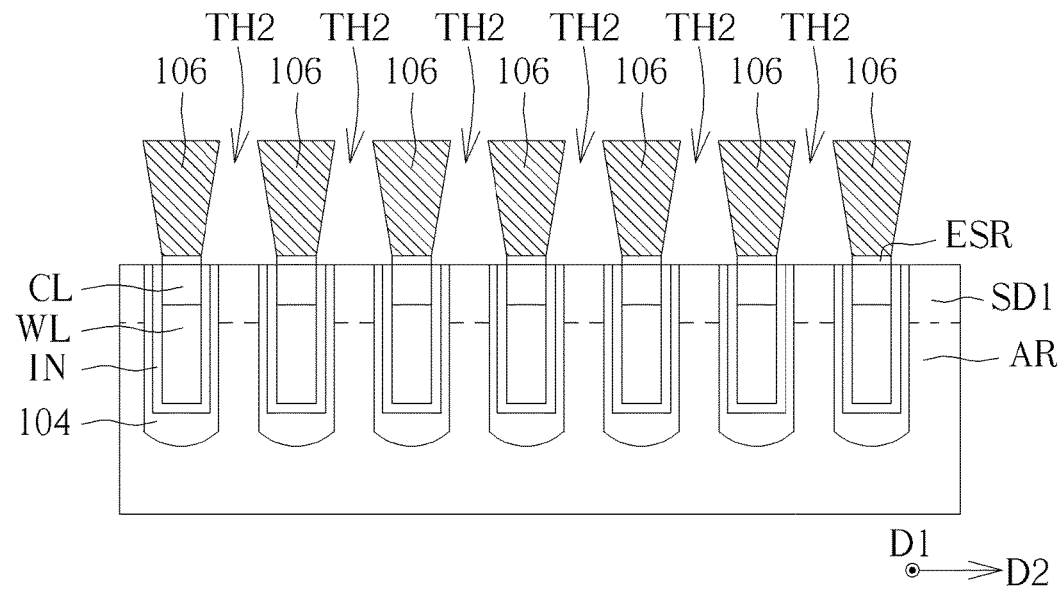
Figure 13:
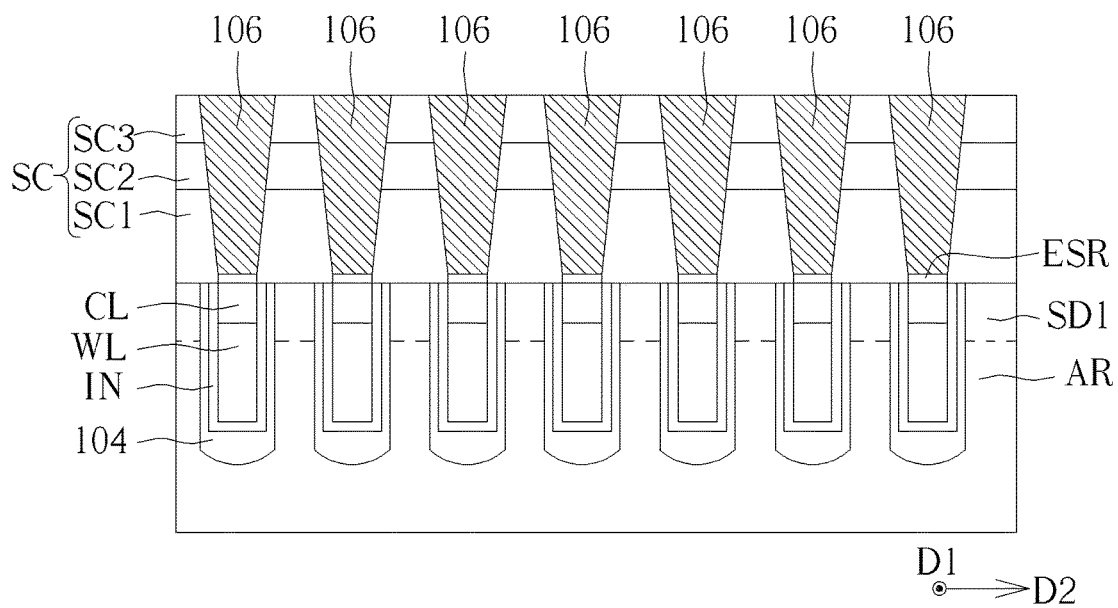

As shown in FIG. 11 and FIG. 12, the dielectric blocks 108R are then removed for exposing the etching stop layer ES. Subsequently, the exposed etching stop layer ES is further etched through for forming a second through hole TH2 between two of the insulation blocks 106 adjacent to each other. Each of the second through holes TH2 has a trapezoid shape in the second direction D2. By the step of forming the second through holes TH2, the first source/drain regions SD1 are exposed, and etching stop blocks ESR are formed. As shown in FIG. 13, the storage node contacts SC are formed in the second through holes TH2 respectively, wherein a width of a top surface of each of the storage node contacts SC in the second direction D2 is smaller than a width of a bottom surface of each of the storage node contacts SC in the second direction D2. For example, deposition processes and etching back processes may be repeatedly performed for forming a stacked structure including the polysilicon layer SC1, the cobalt silicide layer SC2, and the tungsten layer SC3 sequentially stacked in the second through holes TH2. As shown in FIG. 2, the storage node SN is then formed on each of the storage node contacts SC respectively by a photolithographic process and an etching process, wherein the storage nodes SN are separated from one another. After the step of forming the storage nodes SN, a capacitance dielectric layer and a top electrode may be sequentially formed on the storage nodes SN for forming the semiconductor device 100 having DRAM. It is worth noting that each of the insulation blocks 106 has an upside-down trapezoid shape in the second direction D2 before the step of forming the storage nodes SN, and the opening of the second through hole TH2 on the top surface of the insulation block 106 may be relatively smaller than that when the insulation block 106 has a rectangular shape in the second direction D2. Accordingly, the spacing between the top surfaces of the adjacent storage node contacts SC formed in the second through holes TH2 may be relatively larger for increasing the allowable range of shifting error in the second direction D2 during the step of forming the storage nodes SN, and the short circuit problem between the storage node SN and two adjacent storage node contacts SC which is generated by manufacturing variations may be improved.

Based on the above descriptions, in the manufacturing method of the present invention, the width of the top surface of each of the insulation blocks may be larger than the width of the bottom surface of each of the insulation blocks in the second direction, and the width of the top surface of each of the storage node contacts formed in the second through holes may be smaller than the width of the bottom surface of each of the storage node contacts formed in the second through holes in the second direction. The short circuit problem between the storage node and the two adjacent storage node contacts which is generated by manufacturing variations may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a substrate comprising a plurality of active regions, wherein each of the active regions comprises two source/drain regions, and each of the source/drain regions is disposed at a respective end of the active area;
    a plurality of word lines disposed in the substrate, wherein each of the word lines is disposed elongated in a first direction;
    a plurality of bit lines disposed on the substrate, wherein each of the bit lines is disposed elongated in a second direction and straddling the word lines, and each of the source/drain regions is disposed in a region surrounded by two of the word lines adjacent to each other and two of the bit lines adjacent to each other;
    a plurality of storage node contacts disposed on the source/drain regions respectively, wherein a width of a top surface of each of the storage node contacts in the second direction is smaller than a width of a bottom surface of each of the storage node contacts in the second direction; and
    a cap layer disposed on the word lines, wherein each of the storage node contacts is disposed on a plane of a top surface of the cap layer, and each of the storage node contacts has a trapezoid shape in the second direction.

2. The semiconductor device according to claim 1, further comprising:
    a plurality of insulation blocks disposed on the word lines between any two of the bit lines adjacent to each other, wherein a through hole is located between any two of the insulation blocks adjacent to each other, and each of the storage node contacts is disposed in one of the through holes respectively.

3. The semiconductor device according to claim 2, wherein each of the insulation blocks has an upside-down trapezoid shape in the second direction.

4. The semiconductor device according to claim 1, further comprising:
    a plurality of storage nodes, each of which being disposed on a respective storage node contact of the storage node contacts.

5. The semiconductor device according to claim 1, wherein each of the storage node contacts comprises a multi-layer structure.

* * * * *